(12) United States Patent
Lisi et al.

(10) Patent No.: US 7,656,712 B2
(45) Date of Patent: Feb. 2, 2010

(54) METHOD AND CIRCUIT FOR PROGRAMMING A MEMORY CELL, IN PARTICULAR OF THE NOR FLASH TYPE

(76) Inventors: Carlo Lisi, Piazza Cinque Giornate, 6, Milan (IT) 20129; Tecla Ghilardi, Via Todeschini, 12, Trescore Balneario (IT) 24069

( * ) Notice: Subject to any disclaimer, the term of this patent is extended or adjusted under 35 U.S.C. 154(b) by 112 days.

(21) Appl. No.: 12/104,118

(22) Filed: Apr. 16, 2008

(65) Prior Publication Data
US 2008/0259683 A1 Oct. 23, 2008

(30) Foreign Application Priority Data
Apr. 17, 2007 (IT) .......................... MI2007A0777

(51) Int. Cl.
*G11C 160/06* (2006.01)
(52) U.S. Cl. .................... 365/185.2; 365/185.18; 365/189.09
(58) Field of Classification Search .............. 365/185.2, 365/185.18, 185.11, 185.33, 189.07, 189.09
See application file for complete search history.

(56) References Cited

U.S. PATENT DOCUMENTS

| 5,596,532 | A | * | 1/1997 | Cernea et al. | 365/185.18 |
| 5,835,420 | A | * | 11/1998 | Lee et al. | 365/189.09 |
| 5,982,677 | A | * | 11/1999 | Fontana et al. | 365/189.09 |

* cited by examiner

*Primary Examiner*—Gene N. Auduong
(74) *Attorney, Agent, or Firm*—Trop, Pruner & Hu, P.C.

(57) ABSTRACT

A method programs a memory cell comprising: an initial phase in which a continuous voltage is applied to a drain terminal of said memory cell and a suitable programming voltage signal is applied to a gate terminal thereof; a regulation phase in which a constant voltage value is applied to said gate terminal and a voltage value of said drain terminal is regulated so as to be maintained at a fixed value until a threshold voltage value of said memory cell is set at a desired threshold voltage level; and a disable phase that stops said programming and is triggered as soon as a programming current value of said memory cell goes below a reference current value, said reference current value corresponding to the attainment by the threshold voltage value of said memory cell of the desired threshold voltage value. A programming circuit is suitable for implementing this method.

28 Claims, 6 Drawing Sheets

METHOD AND CIRCUIT FOR PROGRAMMING A MEMORY CELL, IN PARTICULAR OF THE NOR FLASH TYPE

BACKGROUND

1. Technical Field

The present invention relates in its more general aspect to a memory cells device, in particular of the NOR Flash type.

More specifically, the invention relates to a method for programming a memory cell, in particular, of the NOR Flash type.

The invention also relates to a suitable circuit to be associated to the basic circuit of the NOR Flash memory cells device in order to implement such a programming method.

2. Description of the Related Art

As it is well known, the reduction of the programming time can be considered one of top requests from Flash memories customers to their suppliers.

The use of the currently available programming method makes more and more difficult to guarantee both a good matching of the time specifications for programming and small distribution width in order to allow the allocation of all bits of a generic multilevel NOR Flash cell. For this reason the introduction of a statistical correction (ECC, or Error Correction Code) or an increasing of the gap among the reference levels has been necessary so far when programming multilevel memory cells.

It is worth reminding that the currently available NOR Flash cells are usually programmed in two phases:
- a programming phase, by means of a sequence of programming voltage pulses, or program pulses and
- a verify reading phase, by means of a sequence of verify reading voltage pulses, or verify pulses.

In particular, during the programming phase, the sequence of program pulses is firstly applied to the cell gate terminal. The pulse amplitude grows at each subsequent program step, according to a time/voltage ramp. Always during the programming phase, the drain voltage value is set to a first fixed voltage value Vd_prog (for instance, equal to 4.2 V).

During the verify reading phase, the voltage value of the drain terminal is set to a second voltage value Vd_ref (for instance, equal to 0.7 V), lower than the first voltage value Vd_prog used for the programming phase (usually set to 4.2V), and a verify reading of the cell threshold voltage value is performed between two consecutive (or chained) program pulses, by applying to the cell gate terminal a verify pulse belonging to the sequence of verify reading voltage pulses, whose amplitude is held constant in any case.

If the so measured cell threshold voltage value turns out to be below a desired program reference level, a further program pulse of the programming voltage pulses sequence is applied to the cell gate terminal. On the contrary, in case the so measured threshold voltage value is above the desired program reference level, the programming phase is concluded and the cell is considered to have been programmed.

The overall programming time can be considered as the sum of the time duration of all pulses, both program and verify pulses, needed to set the threshold voltage value of a cell to the desired program reference level, along with the time requested by the algorithms and the analog circuit, which is connected to the cell for its programming, to switch from a program pulse to a verify pulse, and vice versa.

The main problem related to the previously known programming method is that the request of small distribution width of the cell threshold voltages corresponding to the different programming levels is an issue opposing to the reduction of the programming time, since, in order to have smaller distributions width, the frequency of the verify pulses has to be increased during programming or soft programming phases, ultimately increasing the overall programming time of the cell.

In a multilevel NOR Flash cell the above problem becomes even more critical with respect to a single level cell, because in the first case a higher number of programmed distributions must be contained in a voltage range which becomes smaller and smaller due to the continuous dimension scaling down of silicon integration technologies of the Flash NOR memories. Such a voltage range spans between a minimum voltage level, equal to a voltage value required to have no leakage in the array of NOR Flash cells, and a maximum voltage, equal to a voltage value required to limit the number of failed memory devices for retention issues.

The known programming method for NOR Flash cells used so far, and described here above, does not allow finding an appropriate trade-off between the demand of improving the programming precision, i.e. achieving a smaller distributions width, and the demand of reducing the programming time.

BRIEF SUMMARY

One embodiment is an improved method for programming single level and multilevel NOR Flash memory cells, having functional characteristics to allow finding a trade-off between the opposite desires of reducing the programming time and enhancing the programming precision, wherein the latter is directly related to the reduction of the widths of the distributions, thus overcoming the limits which still affect the devices realized according to the prior art.

One embodiment reduces the programming time through the elimination of the verify reading intermediate pulses and the relative switch times necessary for passing from the programming pulses to the verify reading pulses and vice versa, maintaining an adequate accuracy on the programmed threshold levels of the cells, thanks to the use of a continuous voltage applied to a gate terminal of a cell to be programmed simultaneously with a drain voltage, also constant, through a feedback path, the programming phase being interrupted when the programming current of the cell goes below a predetermined limit value determined so as to correspond to a programmed cell current.

In one embodiment, this limit value is determined in a suitable characterizing phase of the memory cells in which an off-set of the current flowing in the cells is verified when at the drain terminal of these latter a voltage value is applied corresponding to a reading, respectively programming, voltage.

One embodiment is a method for programming at least one memory cell that includes:
- a programming phase in which a continuous voltage is applied to a drain terminal of said memory cell and a suitable programming voltage signal is applied to a gate terminal thereof;
- a simultaneous regulation phase in which a constant value is applied to said gate terminal and a voltage value of said drain terminal is regulated so as to be maintained at a fixed value until a threshold voltage value of said memory cell is set at a desired threshold level; and
- a disabling phase of said programming phase triggered as soon as a programming current value of said memory cell goes below a reference current value, said reference current value corresponding to the attainment by said threshold voltage value of said memory cell of said desired threshold voltage level.

In one embodiment of the programming method, the drain voltage level set during the regulation phase is equal to a drain voltage value used for said memory cell MC during said programming phase.

According to one embodiment of the programming method, the reference current value is statistically determined during a verify phase at a wafer level of a memory device comprising said memory cell for taking the process variability of the manufacturing of said device into account.

One embodiment is a programming circuit of a memory cell inserted between a first voltage reference, in particular a programming one, and a second voltage reference, in particular a ground one, and connected to a drain terminal of said memory cell for regulating a drain voltage value thereof. The circuit comprises:

a regulation transistor, inserted between said first programming voltage reference and a selection circuit of said memory cell to be programmed, in turn inserted between said selection circuit and said second ground voltage reference, said regulation transistor and said selection circuit being interconnected in correspondence with a first inner circuit node having a voltage value fixed at a value equal to a desired programming drain voltage value, by suitably varying the voltage difference between drain and source terminals of said regulation transistor;

a first voltage comparator, supplied by a third voltage reference and having a first input terminal connected to a further fourth voltage reference, having a value equal to said desired programming drain voltage value to compensate and off-set of said voltage value, a second input terminal, feedback connected to said first inner circuit node, as well as an output terminal connected to a gate terminal of said regulation transistor and supplying it with a gate voltage; and a second voltage comparator supplied by said third voltage reference and having a first input terminal, connected to a reference circuit, supplying it with a reference gate voltage value, a second input terminal feedback connected to said output terminal of said first voltage comparator and receiving therefrom said gate voltage of said regulation transistor, as well as an output terminal connected to an enable terminal of said first voltage comparator and supplying it with an enable signal to monitor a drain current value of said memory cell and disable a programming phase of the same, as soon as said drain current value goes below a reference current value.

The characteristics and advantages of the programming method for Flash NOR memory cells and of the electronic circuit used for implementing the method will be evident from the following description of embodiments thereof given by way of indicative and non limiting example with reference to the annexed drawings.

DETAILED DESCRIPTION

Figure 4A:
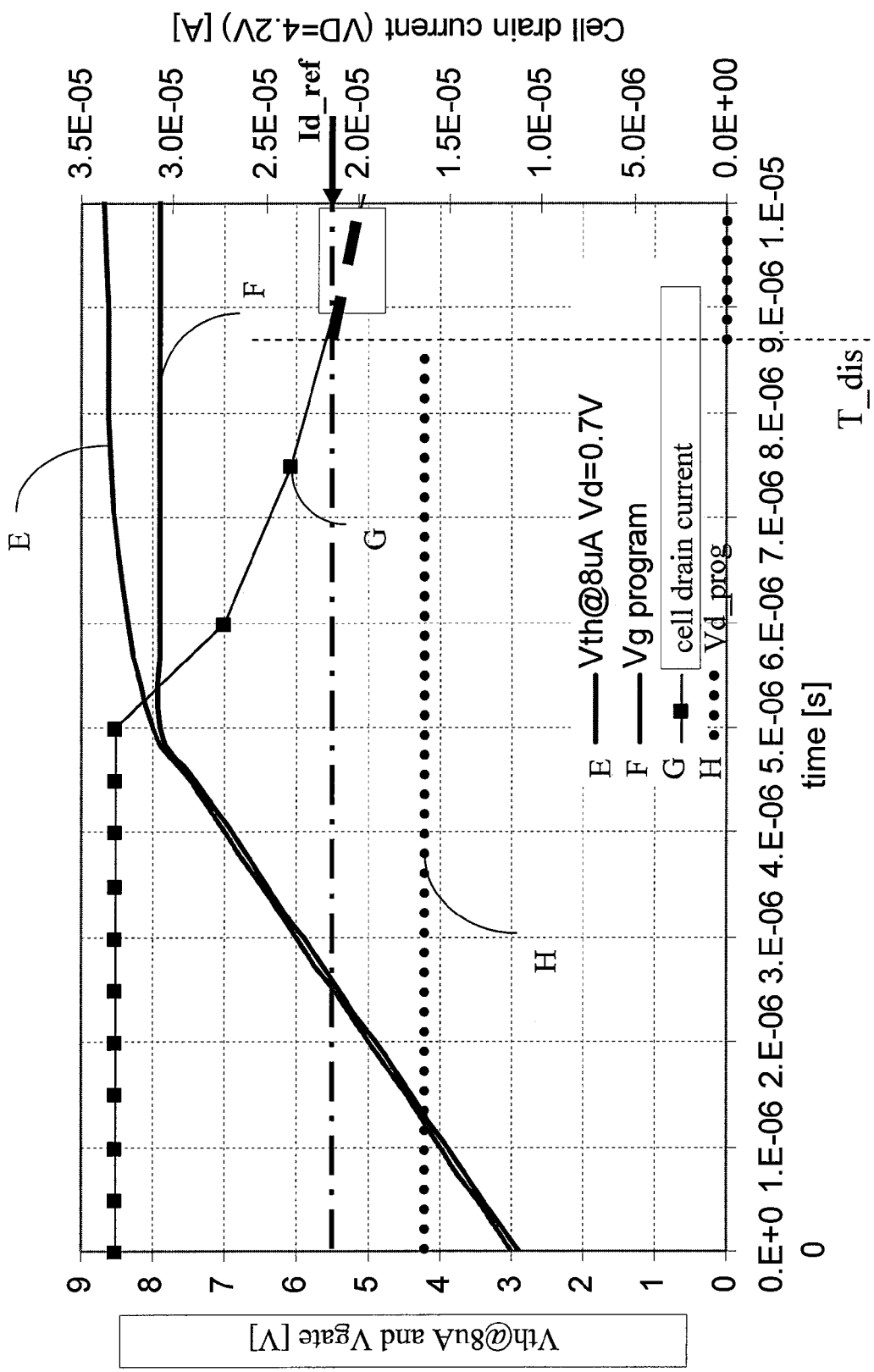
FIGS. 4A and 4B schematically show the trend according to the time of voltage and current signals of a memory cell during its verify reading and programming phases, in case of use of a ramp or constant programming voltage, respectively.
Figure 4B:
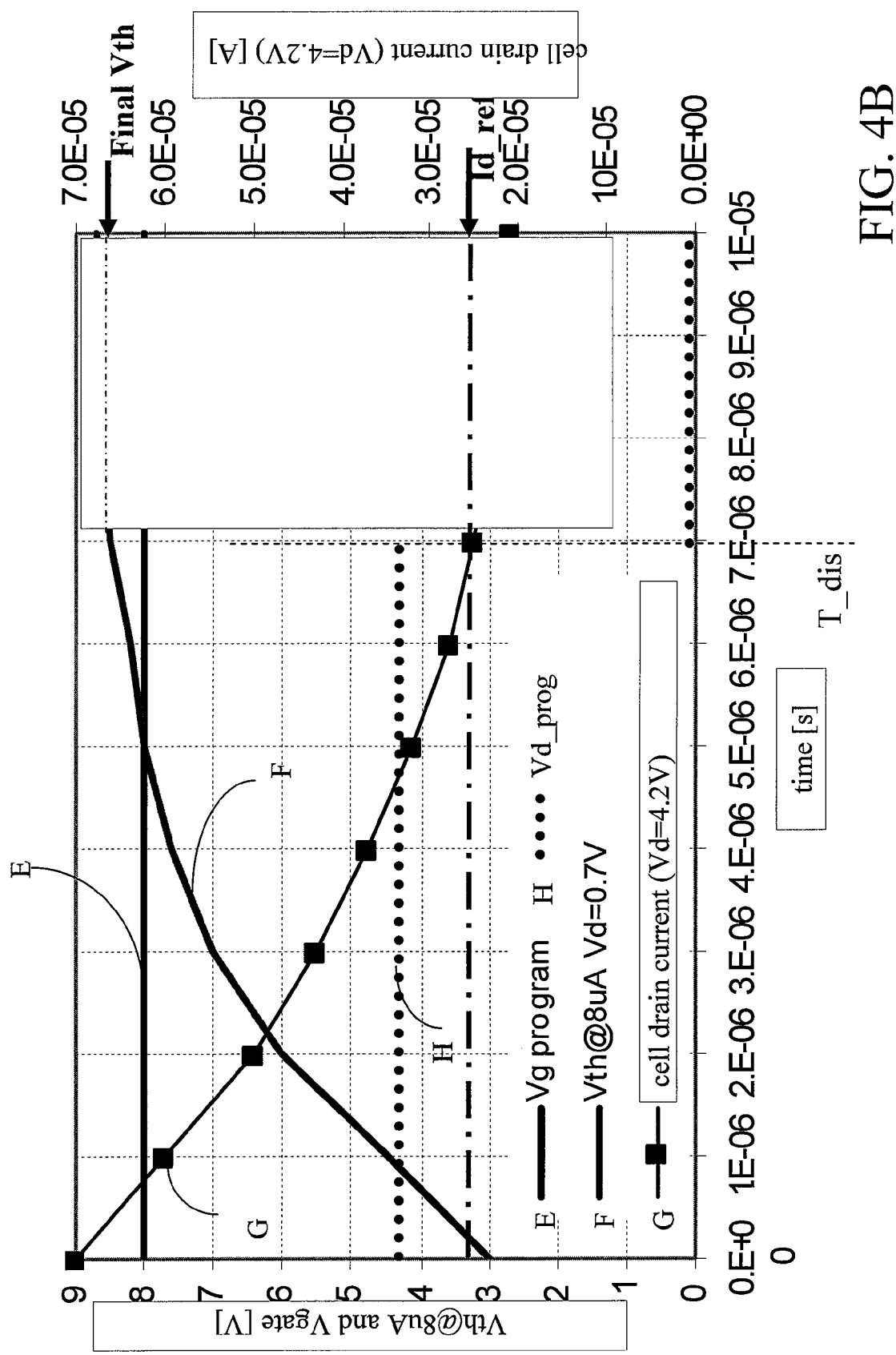

With reference to these figures, and in particular to the examples of FIGS. 4A and 4B, an improved programming method for Flash NOR memory cells is described.

As it will be clear hereafter in the description, the method proposed is based on the elimination of the intermediate verify readings before the threshold voltage value of a cell subjected to programming has been set at a desired programming reference voltage level.

An initial phase of programming is obtained by applying a suitable voltage signal, in particular a voltage pulse or ramp, to the gate terminal of the cell, which saturates at a fixed voltage value, or saturation voltage $V_p$. The method then comprises a regulation phase in which a constant voltage value is applied to the gate terminal of the cell, and simultaneously the voltage value of its drain terminal is regulated through suitable feedback circuit, suitable for maintaining this drain voltage value to a fixed value, indicated as $Vd\_prog$, used during the initial phase. In a preferred embodiment, this constant voltage value applied to the gate terminal of the cell corresponds to a value taken by the voltage signal at the end of the preceding initial phase.

Advantageously, the regulation phase is disabled as soon as the drain current Id of the cell, also called programming current, goes below a suitable reference current value $Id\_ref$, determined so as to correspond to a condition of programmed cell at level 0, respectively 1.

In particular, this reference current value $Id\_ref$ is statistically determined during a verify phase at the wafer level of the memory device, in particular the so called verify phase EWS (acronym of: "Electrical Wafer Sort").

It is suitable to note that the reference current value $Id\_ref$ corresponds to the attainment of the desired cell threshold voltage level, i.e. to the programming condition of the Flash NOR cell.

Advantageously, when it has been verified that the programming current Id of the memory cell is lower than the reference current $Id\_ref$, the programming is interrupted and a programming verify operation is carried out at the reading drain voltage, equal for example to 0.7V.

In this way, the intermediate verify phases normally used in the programming methods according to the prior art are eliminated, the programming of the memory cell being verified thanks to the monitoring of its drain current, a single final program verify phase being thus provided.

In fact, when a constant voltage value is applied to the gate terminal of the memory cell, the current Id flowing in this cell decreases and it is thus possible to interrupt the programming as soon as the current Id goes below the reference current $Id\_ref$.

Advantageously, the voltage value applied to the drain terminal of the cell is maintained constant and in particular equal to a programming voltage value (i.e., 4.2V) and it is no longer necessary to lower it (for example at 0.7V) after each programming pulse to carry out the verify reading phase of the cell. Only after the current Id has gone below the reference current $Id\_ref$ (instant $T\_dis$ in FIGS. 4A and 4B), the programming is disabled.

The method proposed can be used both in case of programming with a voltage ramp, as shown in FIG. 4A, and in case of a programming constant pulse, as shown in FIG. 4B. In both cases, it is verified that the current stops flowing in the memory cell as soon as the drain voltage is interrupted, while the gate voltage can be disabled afterward, for example at the end of a latter cell sharing a wordline subjected to programming.

It is thus important to establish the value of the reference current Id_ref which ensures a correct reading of the cell in correspondence with this different drain voltage value.

The method then comprises a preliminary characterizing phase of the memory cells, suitably of the statistical type, in which the off-set is identified of the current flowing in the cells in correspondence with a programming (for example of 4.2V) and reading (for example 0.7V) drain voltage and in which the reference current value Id_ref is established.

In particular, this reference current Id_ref is equal to a minimum current value which allows a correct reading of the cell to whose drain terminal a programming voltage is applied (for example equal to 4.2V). It is also possible to fix this reference current Id_ref with a suitable margin with respect to this minimum current value.

As it will be clear hereafter in the description, the regulation of the drain voltage of the memory cell at a desired drain voltage value Vd_prog is obtained through a feedback path suitable to maintain the drain terminal of a MOS regulation transistor at a fixed potential, the source terminal of this transistor being connected to the drain terminal of the memory cell, in turn having a source terminal connected to a ground voltage reference.

Moreover, the drain current is suitably monitored indirectly by comparing a gate voltage value GATE_CASC on the gate terminal of this regulation transistor with a reference gate voltage GATE_CASC_REF corresponding to the reference programming current Id of the memory cell, ensuring at the same time that the voltage difference between the drain and source terminals of the memory cell is maintained at the desired programming drain voltage value Vd_prog.

As it will be clear hereafter in the description, the reference gate voltage value GATE_CASC_REF is compared to the voltage of the regulation transistor gate terminal through a reference circuit comprising a further MOS enable transistor, similar in behavior to the regulation transistor and having a drain terminal connected to a programming voltage reference and a source terminal connected to a reference inner circuit node maintained at said desired programming drain voltage value Vd_prog.

Further, the disabling of the programming phase of the memory cell is obtained by disabling the regulation transistor, by comparing a programming current of the cell with the reference current Id_ref, fixed through software so as to take the process variability in the manufacturing of the cell itself into account, as determined during the verify phase EWS, the programming current values of the memory cell being measured when its cell threshold voltage value is set at a desired threshold voltage value Vth_target and maintaining its drain voltage level at a fixed level, in particular equal to the desired programming drain voltage value Vd_prog.

Figure 1A:
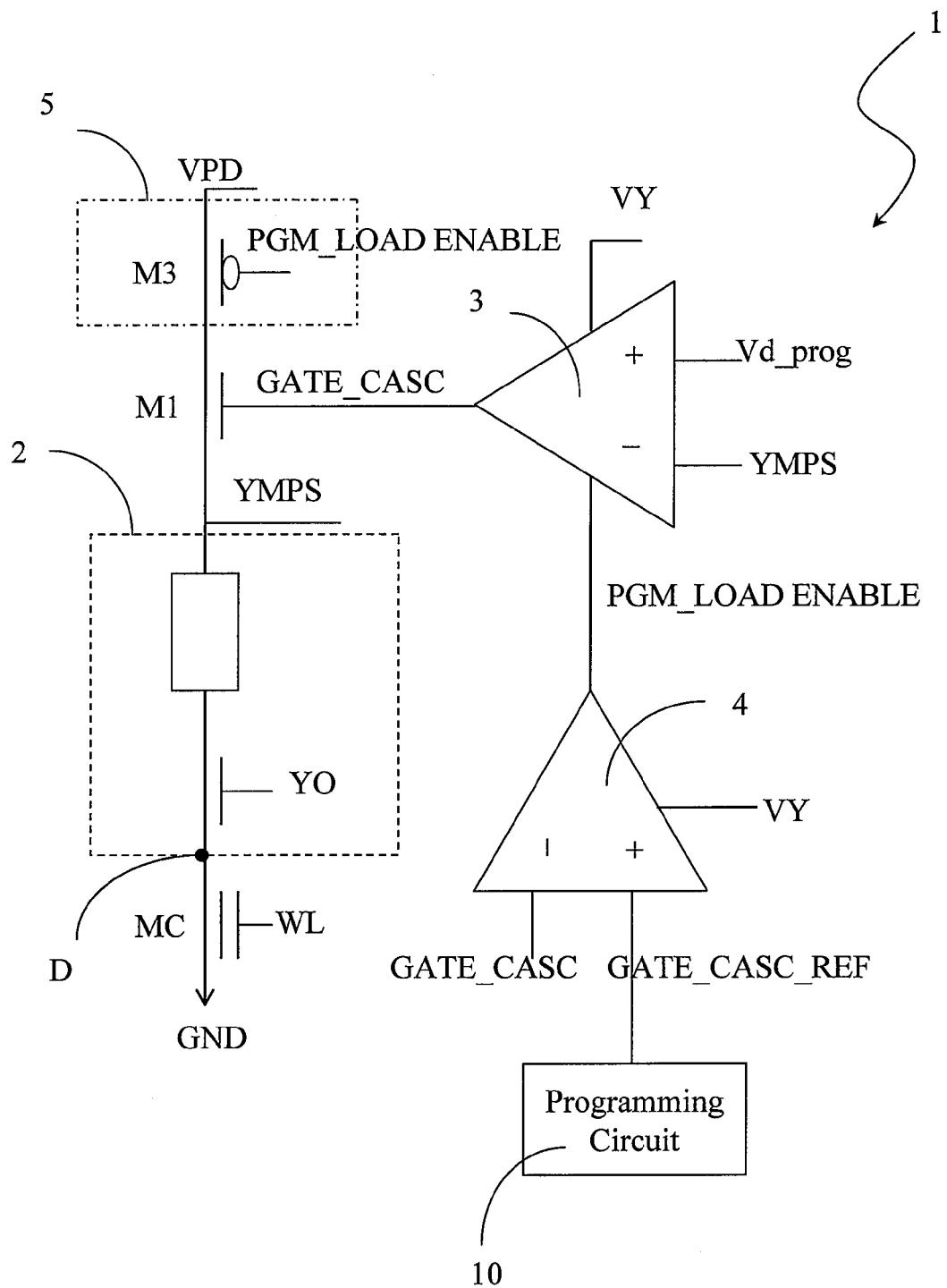
FIG. 1A schematically shows a programming circuit of memory cells, in particular of the NOR Flash type.

The programming method is implemented by a programming circuit, schematically shown in FIG. 1A, globally indicated with 1.

In particular, this programming circuit 1 allows to regulate a voltage value Vd of a drain terminal D of a memory cell MC, in particular of the Flash NOR type. As it will be clear hereafter in the description, the drain voltage value Vd is suitably fixed at a desired value, the desired programming drain voltage value Vd_prog.

To this purpose, the programming circuit 1 comprises a regulation transistor M1, inserted between a first voltage reference, in particular a programming voltage reference VPD (for example equal to 15V) and a selection circuit 2 of the memory cell MC to be programmed, in turn inserted between the selection circuit 2 and a second voltage reference, in particular a ground GND. The selection circuit 2 also receives a selection voltage value YO.

More in particular, the regulation transistor M1 and the selection circuit 2 are interconnected in correspondence with a first inner circuit node YMPS having a first voltage inner value. For simplicity of illustration, hereafter in the description the same alphanumeric references will be used to indicate circuit nodes and corresponding voltage signals present thereat.

Advantageously, the voltage value on the first inner circuit node YMPS is fixed at a value equal to the desired programming drain voltage value, Vd_prog, by suitably varying the voltage difference between the drain and source terminals of the regulation transistors M1.

In particular, once the programming voltage reference value VPD has been fixed, the regulation transistor M1 allows to regulate the voltage value on the first inner circuit node YMPS so as to correctly compensate its off-set with respect to the desired programming drain voltage value Vd_prog.

Suitably, this regulation of the voltage difference between the drain and source terminals of the regulation transistor M1 is in turn obtained by suitably varying the voltage on its gate terminal, GATE_CASC.

To this purpose, the programming circuit 1 further comprises a first voltage comparator 3, supplied by a third voltage reference VY and having an output terminal connected to the gate terminal of the regulation transistor M1 and supplying it with the gate voltage GATE_CASC. The first voltage comparator 3 also has a first input terminal, in particular a non-inverting (+) terminal, connected to a further fourth voltage reference, having a value equal to the desired programming drain voltage value, Vd_prog, a second input terminal, in particular an inverting (−) terminal, feedback connected to the first inner circuit node YMPS, as well as an enable terminal connected to a second voltage comparator 4.

The connection of the fourth voltage reference having the desired programming drain voltage value Vd_prog at the first inner circuit node YMPS through the first voltage comparator 3 substantially allows to compensate, in correspondence with the first inner circuit node YMPS connected to the memory cell MC, the off-set of this desired programming drain voltage value Vd_prog.

Advantageously, the second voltage comparator 4, supplied by the third voltage reference VY, has a first input terminal, in particular a non-inverting (+) terminal, connected to a reference circuit, globally indicated with 10, supplying it with a reference gate voltage value GATE_CASC_REF, a second input terminal, in particular an inverting (−) terminal, feedback connected to the output terminal of the first voltage comparator 3 and receiving therefrom the gate voltage GATE_CASC of the regulation transistor M1, as well as an output terminal connected to the enable terminal of the first voltage comparator 3 and supplying it with an enable signal PGM_LOAD ENABLE.

In this way, as it will become clear hereafter in the description, the programming circuit 1 monitors a programming current value flowing in the memory cell MC so as to disable the programming phase of the cell itself, as soon as this programming current value goes below a limit value, in particular the reference current Id_ref. An adequate setting of the desired threshold voltage value, Vth_target, of the memory cell MC is thus obtained.

Finally, the programming circuit 1 comprises an enable block 5, inserted between the programming voltage reference VPD and the regulation transistor M1 and comprising an enable transistor M3 having a control or gate terminal receiving the enable signal PGM_LOAD ENABLE.

In particular, the reference gate voltage value GATE_CASC_REF corresponds to a programming current value equal to the reference current limit value Id_ref when the voltage between drain and source of the memory cell MC is maintained fixed at a value equal to the desired programming drain voltage value Vd_prog.

Figure 1B:
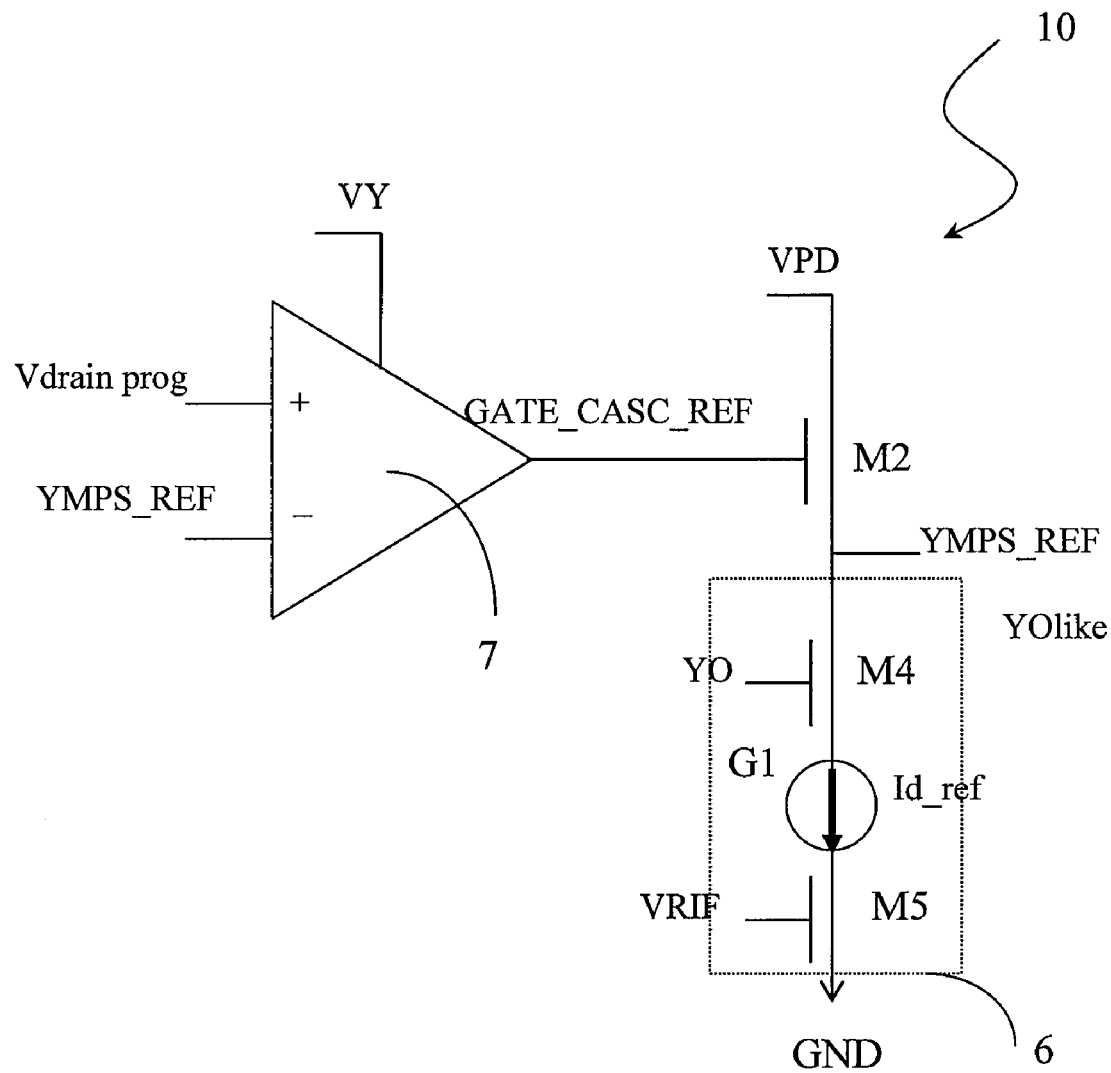
FIG. 1B schematically shows a reference circuit associated with the programming circuit of FIG. 1.

Advantageously, the reference gate voltage value GATE_CASC_REF is obtained by the reference circuit 10, shown in FIG. 1B.

Suitably, this reference circuit 10 has a structure that replicates the structure of the programming circuit 1 and comprises in particular a duplicated regulation transistor M2, inserted between the programming voltage reference VPD (for example equal to 5V) and a duplicated selection circuit 6 of the memory cell MC to be programmed, in turn connected to the ground GND.

More in particular, the duplicated regulation transistor M2 and the selection circuit 6 are interconnected in correspondence with a third inner circuit node YMPS_REF having a first voltage inner value, this selection circuit 6 showing the same voltage—current characteristic of the memory cell MC when programmed at a desired threshold voltage level and allowing to set the reference current value Id_ref via software.

It is to be noted that also the value of the potential on the third inner circuit node YMPS_REF is suitably maintained at the desired programming drain voltage value Vd_prog. To this purpose, the reference circuit 10 then comprises a third voltage comparator 7, supplied by the third voltage reference VY and having an output terminal connected to the gate terminal of the duplicated regulation transistor M2 and supplying it with the reference gate voltage value GATE_CASC_REF. This third voltage comparator 7 also has a first input terminal, in particular a non-inverting (+) terminal, connected to the fourth voltage reference, having a value equal to the desired programming drain voltage value, Vd_prog as well as a second input terminal, in particular an inverting (−) terminal, feedback connected to the third inner circuit node YMPS_REF.

The connection of the fourth voltage reference having the desired programming drain voltage value Vd_prog at the third inner circuit node YMPS_REF through the third voltage comparator 7 substantially allows, similarly to what occurs in the programming circuit 1, to compensate, in correspondence with the first inner circuit node YMPS connected to the memory cell MC, the off-set of this desired programming drain voltage value Vd_prog, in particular by suitably varying the gate voltage value of the duplicated regulation transistor M2, and then the voltage between the drain and source terminals of this transistor, the programming drain voltage reference VPD having a fixed value.

Advantageously, the value of the reference current Id_ref flowing in the selection circuit 6 of the reference circuit 10 is set via software, in particular equal to a value of the current flowing in the programming circuit 1 when the memory cell MC is programmed at a desired threshold voltage level.

To this purpose, the selection circuit 6 comprises a fourth and a fifth transistor, M4 and M5, inserted, in series with each other, between the third inner circuit node YMPS_REF and the ground GND and having respective control or gate terminals receiving the selection voltage value YO and a reference voltage value VRIF. The selection circuit 6 also comprises a generator G1 of the reference current Id_ref, adjustable via software.

In this way, the reference gate voltage value GATE_CASC_REF is applied to the gate terminal of the duplicated regulation transistor M2 and is compared, through the second voltage comparator 4, to the gate voltage value GATE_CASC of the gate terminal of the regulation transistor M1 so as to determine the instant in which the memory cell MC is programmed.

Suitably, the value of the reference current Id_ref is determined during the verify phase EWS and takes into account the process variability of the manufacturing of the silicon devices such as a memory device of the Flash NOR type comprising the memory cell MC.

Advantageously, the programming phase of the memory cell MC is ended by disabling the regulation transistor M1 by means of the second voltage comparator 4, which compares the gate voltage value GATE_CASC to the reference gate voltage value GATE_CASC_REF and outputs the enable signal PGM_LOAD_ENABLE, used to turn on and off the first voltage comparator 3.

In particular, if the gate voltage value GATE_CASC is equal to the reference gate voltage value GATE_CASC_REF, the first voltage comparator 3 is turned off by the enable signal PGM_LOAD_ENABLE supplied by the second voltage comparator 4, and the programming phase of the memory cell MC is ended with the cell programmed at the desired threshold voltage level, Vth_target.

The programming circuit 1 is used for generating a feedback signal for the memory cell MC and for disabling the programming phase as soon as this cell is programmed at the desired threshold voltage level, Vth_target, while the reference circuit 10 is used for generating a reference current Id_ref and a reference gate voltage, GATE_CASC_REF, used for disabling the programming phase in the programming circuit 1.

In this way, the regulation of the drain voltage of the memory cell MC at the desired programming drain voltage value Vd_prog is obtained through a feedback path which maintains the drain terminal of the regulation transistor M1 at a fixed voltage value, its source terminal being connected to the drain terminal of the memory cell MC, having in turn the source terminal connected to ground.

Moreover, the programming current Id, in particular the drain current of the memory cell MC is indirectly monitored by comparing the gate voltage GATE_CASC on the gate terminal of the regulation transistor M1 with the reference gate voltage value GATE_CASC_REF corresponding to the reference current Id_ref, while the voltage between drain and source of the memory cell MC is maintained at the desired programming drain voltage value Vd_prog.

In particular, this reference gate voltage value GATE_CASC_REF is compared to the gate voltage GATE_CASC of the regulation transistor M1 through the reference circuit 10 comprising the duplicated regulation transistor M2, suitably similar in behavior to the regulation transistor M1 and whose drain terminal is connected to the programming drain voltage reference VPD while the source terminal is connected to the third inner circuit node YMPS_REF.

Advantageously, the disabling of the programming phase of the memory cell MC is obtained by disabling the regulation transistor M1 through the second voltage comparator 4, which compares the gate voltage value GATE_CASC with the reference gate voltage value GATE_CASC_REF, the output terminal of this second voltage comparator 4 supplying the enable signal PGM_LOAD ENABLE to the enable terminal of the first voltage comparator 3, in turn having the output terminal connected to the gate terminal of the regulation transistor M1.

In particular, this disabling of the programming phase of the memory cell MC is obtained by comparing its programming current Id with the reference current Id_ref, taking into account the variability of the manufacturing process of the cell itself, as determined during a verify phase EWS, the values of the drain current of the memory cell MC being measured when its threshold voltage value is set at the desired threshold voltage value Vth_target and maintaining its drain voltage value fixed at the desired programming drain voltage value Vd_prog.

In practice, the first voltage comparator 3 acts as drain voltage regulator and allows the programming of the memory cell MC with an efficient drain value (equal to Vd_prog) established by the process data, while the second voltage comparator 4 disables this programming when the memory cell MC is supposed to be programmed at the desired value through the comparison of the programming current Id, in particular the current absorbed along the bitline the cell belongs to, with the reference current Id_ref, converted into terms of voltage of the gate terminal of the regulation transistor M1.

When this programming current Id is lower than the reference current Id_ref, the programming circuit 1 is turned off and the cell is verified through suitable verify sense amplifiers (not shown) to carry out the programming verify operation at the reading drain voltage, for example equal to 0.7V.

The dynamic behavior of the programming circuit 1 above described, during the programming phase, can be summarized as follows.

A pulse or voltage ramp applied to the gate terminal of the memory cell MC grows, thus making also the threshold voltage value of this cell grow. The voltage value at the first inner circuit node YMPS, i.e. the voltage between the drain and source terminals of the memory cells MC, is maintained constant at the desired programming drain voltage value, Vd_prog, through a feedback path comprising the first voltage comparator 3 and the regulation transistor M1.

As a consequence, at the end of a possible gate voltage ramp, the programming ramp Id flowing in the programming circuit 1 decreases, and also the gate voltage value GATE_CASC of the gate terminal of the regulation transistor M1 varies.

The memory cell MC is programmed as soon as the programming current Id goes below the reference current value Id_ref, suitably determined by statistically sampling an adequate number of memory devices during the verify phase EWS.

In this way, the gate voltage value GATE_CASC attains the corresponding reference gate voltage value GATE_CASC_REF.

Suitably, the reference circuit 10 is used to generate the reference gate voltage value GATE_CASC_REF, while the programming circuit 1 compares it with the gate voltage value GATE_CASC (through the second voltage comparator 4), thus generating the enable signal PGM_LOAD_ENABLE which disables the first voltage comparator 3 as soon as the gate voltage values GATE_CASC and reference gate voltage values GATE_CASC_REF are equal, thus providing the further raising of the threshold voltage value of the memory cell MC to be programmed.

When the programming circuit 1 is off, the correctness of the programming phase is verified by reading the programmed threshold voltage value at a verify drain voltage value Vd_ref, set between the drain and source terminals of the memory cell MC, used during a verify reading phase and typically equal to 0.7V.

It is also important to point out that, for a given programming current Id, i.e. for a drain current flowing in the memory cell MC, an off-set occurs between the threshold voltage values of the cell as measured in correspondence with the verify drain voltage value Vd_ref used during the verify reading phase and with the desired programming drain voltage value Vd_prog (greater than the verify one), used during the programming phase. Such an off-set depends on the distance between the source and drain junctions of the memory cell MC, and thus on the size of the gate of the cell itself.

Figure 2B:
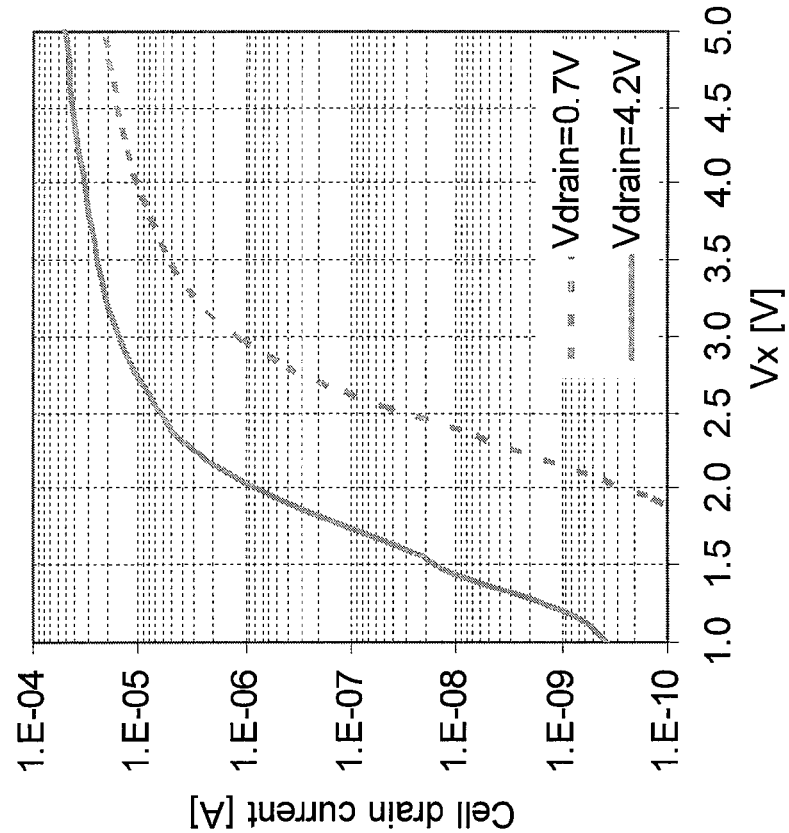
FIGS. 2A and 2B schematically show the trend of the current-voltage characteristics of a memory cell when its drain voltage varies, for respective values of the junction distance of the cell itself.
Figure 2A:
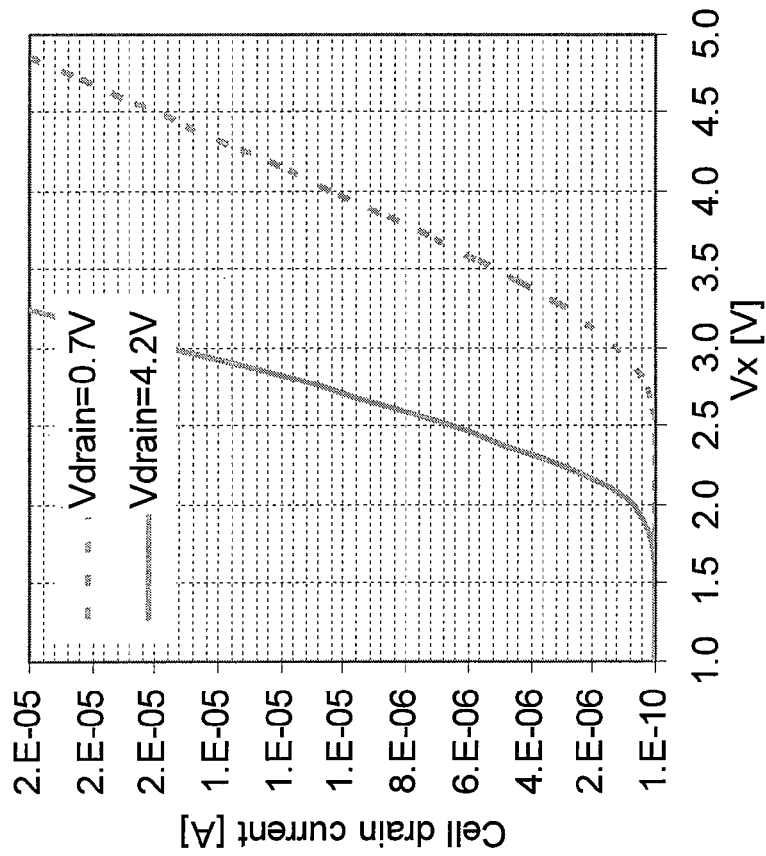

In particular, FIGS. 2A and 2B show the trend of the drain current of a memory cell, respectively in linear and logarithmic scale, for two different drain voltage values Vd, equal to 0.7V and 4.2V respectively.

More in detail, FIG. 2A shows, in linear scale, the trend of the drain current and highlights the linear trait of the transfer characteristic, while FIG. 2B shows this trend in semilogarithmic scale and highlights the underthreshold exponential trait, further including the trait with decreasing gain (at high Vg=Vx).

Figure 3:
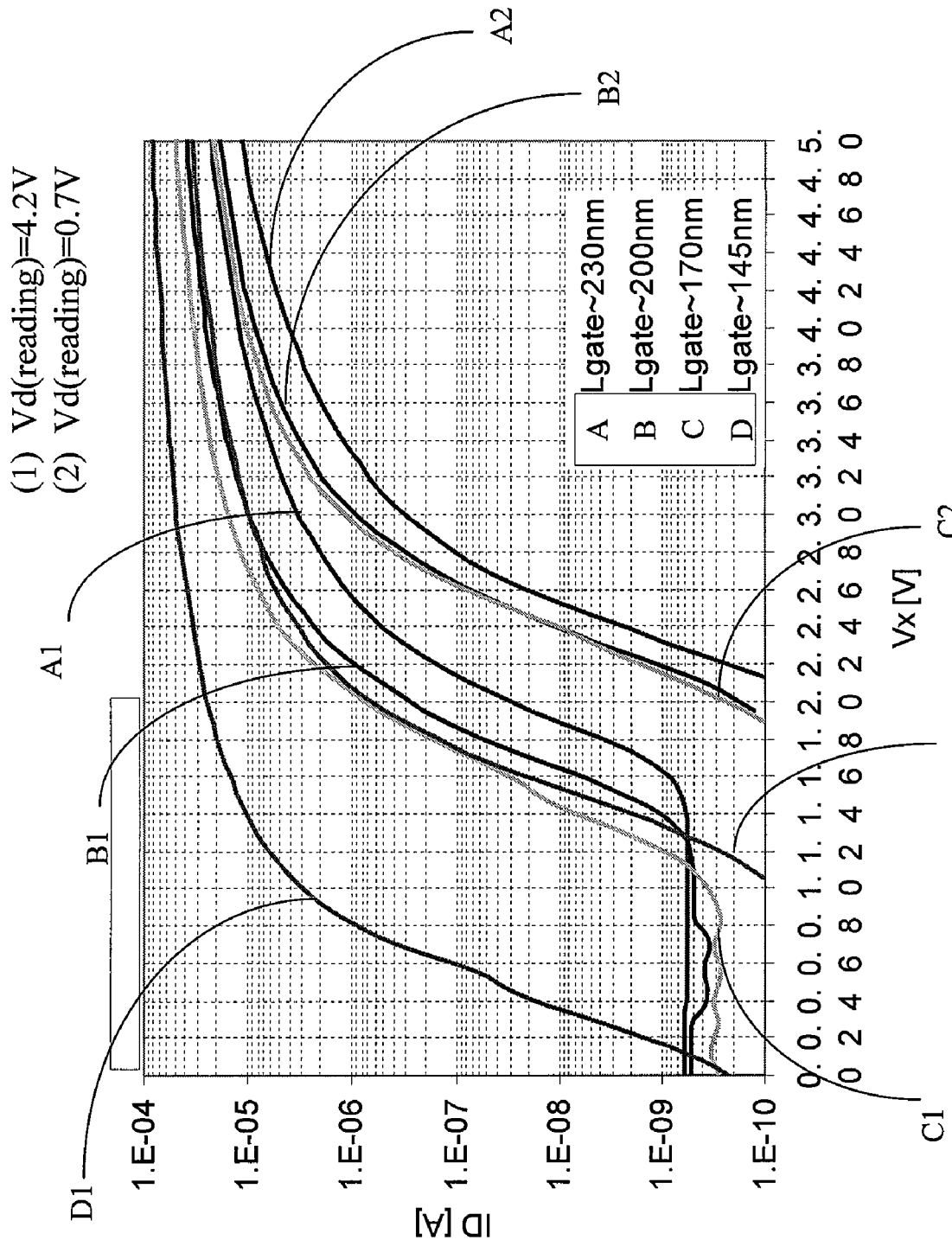
FIG. 3 schematically shows the trend of the current-voltage characteristic of a memory cell when its gate length varies.

Finally, the variation of the off-set between the threshold voltage values is a function of the length of the cell as shown in FIG. 3.

More specifically, such an off-set between the threshold voltages of the memory cell MC derives from the superposition of two effects, the drain turn-on effect and the DIBL (acronym of: "Drain Induced Barrier Lowering") effect of the cell itself, which strongly depend on the distance between the source and drain junctions, i.e. on the size of the cell gate. In particular, FIG. 3 shows the dependency of the voltage off-set on the gate size of a memory cell MC for different values of its length (from 145 to 230 nm).

Supposing that the extension of this gate size on a lot of produced devices, although taking into account the unpredictability of the manufacturing process of the devices themselves, could be considered as negligible, a single value of the above off-set can be considered for all the devices of the batch, thus allowing a single reference current value Id_ref for all the devices to be processed during the verify phase EWS, and substantially used in the reference circuit 10 to determine the reference gate voltage value GATE_CASC_REF at which the programming circuit 1 should be turned off.

It is also noted that neither the drain turn on effect nor the DIBL effect change consequently to the cyclical variation of the cell. The off-set of the threshold voltage value of the gate terminal can thus be taken as a constant during the life of the memory device. This substantially means that the reference current value Id_ref does not need to be regulated during the life of the device itself.

On the other hand, the dependency of the DIBL effect on the temperature of the cell cannot be neglected, therefore a suitable matching of the reference current value Id_ref is necessary with respect to the temperature of the cell indeed, so as to allow the programming of the correct threshold voltage level.

The time evolution of this cell threshold voltage during the programming of the cell itself, together with the programming current Id, i.e. to the drain current of the cell, are shown in FIG. 4 by way of example, so as to point out the two characterizing phases of the programming phase of the memory cell MC.

In the first phase of the cell programming, its gate voltage Vg linearly grows and its threshold voltage Vth makes its pattern match, while the programming current Id (drain) of the cell is constant.

In the second phase of the cell programming, called convergence phase, the gate voltage of the cell has reached a constant saturation value, Vp, and the threshold voltage of the cell has a logarithmic growth, while the programming current Id has a quick decrease. Such a behavior ensures a good accuracy in the setting of the threshold voltage Vth of the cell, without requiring a high accuracy in the current reading.

As a matter of fact, the cell gain value (i.e. the ratio DI/DVG between the drain current variation, DI, and the gate voltage variation, DVG, which has produced the drain current variation DI, when the drain voltage Vd is maintained fixed) read when the drain voltage Vd is set at the desired drain voltage value Vd_prog of the programming phase, is higher than the cell gain value read when the drain voltage Vd is set at the verify value, usually equal to 0.7V.

In particular, from FIGS. 2 and 3 and in particular from the derivative of the trans-characteristic shown therein, it is verified that the cell gain related to the programming phase, i.e. for a drain voltage value Vd equal to the desired programming voltage value Vd_prog=4.2V, is double (line C1) with respect to the cell gain related to the verify phase, i.e. for a drain voltage value Vd equal to the reference voltage value Vd_ref=0.7 V (line C2).

As previously said, when the programming phase of the memory cell is ended, i.e. the relative programming or drain current Id has gone below the reference current Id_ref, a verify reading phase can be carried out by setting the drain value Vd of the cell at the reading value Vd_ref (lower than the desired programming drain voltage value Vd_prog) and the gate voltage value of the cell at the verify gate voltage value, Vverify (i.e. a voltage value of the gate terminal at which the cell is verified for a determined programming level).

If this verify reading phase does not allow the attainment of a drain current Id lower than the reference current Id_ref, the programming phase is repeated by applying a voltage step to the gate terminal of the cell, with amplitude equal to the maximum of the voltage ramp applied to the gate terminal of the cell, i.e. the saturation voltage Vp, used in the previous programming phase and by using a lower value of the reference current Id_ref.

It is also possible to apply a greater saturation voltage amplitude Vp to the gate terminal, maintaining the same value of the reference current Id_ref.

In case a different gate voltage value is used, the current value Id_ref will vary correspondingly (if the same desired threshold voltage value is to be maintained Vth_target) to compensate a different off-set.

Further advantageously, by using the programming method proposed with suitable programming algorithms repeating the reference current values Id_ref for the programming, it is possible to reduce the width of the distributions and avoid an excessive coupling effect between floating gate regions of the memory cells during the recovery or soft programming phase successive to an erasing phase, thus ensuring an efficient soft programming of the cells, which does not need intermediate verify readings.

The programming method is thus particularly advisable also for the soft programming (recovery after erasing) of the cells, since with more and more aggressive technologies, the short distances in matrix and the consequent interactions between the charges of the cells themselves during the programming operations, lead towards the need of using a convergence pulse so as not to modify the state of previously "placed" cells (i.e., already verified as correctly programmed).

Several firmware algorithms can be used for implementing the proposed programming method, in particular in the following two main categories:

for the optimization of the reference circuit: using a single reference circuit with a same value of the reference current Id_ref and different saturation voltage values Vp for the voltage ramp applied to the gate terminal of the cell, one for each threshold voltage level to be programmed, indicated with Vpi, where the index i varies between 1 and the number of programmable levels of the cell;

for the optimization of the parallel operation: using for all the possible programming levels a same saturation voltage value Vp of the voltage ramp applied to the gate terminal of the cell and different reference current values Id_ref for the programming; in this case, for each reference current level to be programmed, a specific reference circuit is provided and the programming circuit 1 comprises respective selection pass-gates of the comparator of the reference circuit suitable for the current level to be programmed.

In conclusion, the programming method for memory cells, in particular of the Flash NOR type, is based on the elimination of the intermediate verify reading phases of the threshold voltage value of the cell to be set at the desired reference voltage level. The programming phase, which applies a continuous voltage ramp to the gate terminal of the cell, is interrupted as soon as the drain current of the cell goes below a suitable reference value, which corresponds to the attainment of the desired cell threshold voltage level. At this point, the cell is considered as programmed, and the correctness of the programmed value is verified through a single final verify reading phase.

In this way, the programming time of the memory cells is decreased with respect to the traditional programming methods, the number of the verify readings and the number of passages between program-to-verify and verify-to-program voltage pulses being drastically reduced.

Further, by using this programming method with suitable algorithms repeating the values of the reference current for the programming, it is also possible to reduce the width of the distributions and avoid an excessive coupling effect between floating gate regions of the cells, in particular during the recovery or soft programming phase further to an erasing phase, this soft programming phase being efficient also without verify readings.

The main advantages of the programming method and of the circuit proposed can thus be summarized as follows:

elimination of the intermediate verify reading phases of the threshold voltage value of the cell to be programmed;

verify of the programming of the cell at the desired value through the comparison of the programming current Id, in particular the current absorbed along the bitline the cell belongs to, with a reference current Id_ref;

correctness of the programmed value verified through a single final verify reading phase;

reduction of the programming time and of the recovery time after erasing (soft programming);

determination of the reference current value Id_ref, by statistically sampling an adequate number of memory devices during the verify phase EWS ("Electrical Wafer Sort"), this value being taken as a constant during the life of the memory device;

improvement of the programming accuracy in the setting of the threshold voltage value of the memory cells; and removal of the coupling effects between floating gate regions during the soft programming.

The programming method, thanks to the remarkable reduction of the number of verifications carried out for "placing" a cell, as well as of the number of times in which one passes from the programming pulse to the successive verify, allows to reduce the time necessary to the programming of a cell and, with suitable supports of the analog structures (for example, charge pumps), can represent a substantial possibility of improvement in the programming performances of the memory devices, in particular of the NOR Flash type, one of the main parameters through which the products are judged by the clients prior to deciding the purchase thereof.

Obviously, to the purpose of meeting contingent and specific needs, a technician of the field will be allowed to bring several modifications and variations to the above described method and device, all within the scope of protection of the invention.

In particular, it is possible to use the programming method proposed in case of multilevel memories, wherein there can then be more reference current values Id_ref, each corresponding to a different desired threshold voltage value Vth_target. In this case, desired threshold voltage increasing values, Vt_target(1)<Vt_target(2)<Vt_target(3), will correspond to decreasing reference current values, Id_ref(1)>Id_ref(2)>Id_ref(3).

In this particular case, it is possible to provide that the programming phase of the method according to the invention, without intermediate verifications at Vd=0.7V, is used for quickly approaching (in an approximate or "coarse" way) the threshold voltage of the multilevel cells to corresponding desired or target threshold voltage values (Vth_target(1), Vth_target(2), Vth_target(3)), for being then followed by a conventional fine programming phase characterised by the usual sequence of programming pulses (with Vd=Vd_prog=4.2V) followed by a verify (with Vd=0.7V) up to the attainment of the exact desired value.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A programming method, comprising:
applying a continuous voltage to a drain terminal of a memory cell and a suitable programming voltage signal to a gate terminal of the memory cell;
applying a constant voltage to said gate terminal and regulating a voltage of said drain terminal while the constant voltage is applied to the gate terminal; the regulating including maintaining the voltage of said drain terminal substantially at a fixed value until a threshold voltage value of said memory cell reaches a desired threshold voltage level; and
stopping the regulating in response to detecting that a programming current value of said memory cell goes below a reference current value, said reference current value corresponding to the threshold voltage of said memory cell reaching said desired threshold voltage level.

2. The programming method according to claim 1, wherein the fixed value of the drain voltage during said regulating is equal to the continuous voltage applied to the drain terminal.

3. The programming method according to claim 2, wherein said reference current value corresponds to the attainment of a threshold voltage level under a programming condition of said memory cell.

4. The programming method according to claim 1, further comprising a preliminary characterizing phase of said memory cell in which a programming current off-set is identified of said memory cell in correspondence with voltage values applied to said drain terminal thereof and corresponding to a programming drain voltage and to a reading drain voltage and in which a value of said reference current is established.

5. The programming method according to claim 4, wherein said preliminary characterizing phase establishes said value of said reference current equal to a minimum current value which allows a correct reading of said memory cell.

6. The programming method according to claim 4, wherein said preliminary characterizing phase establishes said value of said reference current equal to a minimum current value which allows a correct reading of said memory cell plus a suitable margin.

7. The programming method according to claim 4, wherein said preliminary characterizing phase is a statistical verify phase at a wafer level of a memory device that includes said memory cell.

8. The programming method according to claim 1, further comprising, after stopping the regulating, implementing a final program verify phase by applying, to the drain terminal of said memory cell, a reading drain voltage.

9. The programming method according to claim 8, wherein said regulating employs a feedback path suitable for maintaining a drain terminal of a regulation transistor coupled to said memory cell at a fixed potential, a source terminal of said regulation transistor being coupled to said drain terminal of said memory cell, in turn having a source terminal connected to a voltage reference.

10. The programming method according to claim 9, further comprising indirectly monitoring a drain current of said memory cell by comparing a gate voltage value at a gate terminal of said regulation transistor with a reference gate voltage value corresponding to a programming drain current of said memory cell, and ensuring at the same time that a voltage difference between drain and source terminals of said memory cell is maintained at said desired programming voltage value.

11. The programming method according to claim 10, wherein said indirectly monitoring employs a reference circuit coupled to said regulation transistor and including a further regulation transistor, similar in behavior to said regulation transistor and having a drain terminal connected to a programming drain voltage reference and a source terminal connected to a reference inner circuit node maintained at said desired programming drain voltage value.

12. The programming method according to claim 11, wherein said stopping includes disabling said regulation transistor by comparing said drain current of said memory cell with said reference current value, said drain current of said memory cell corresponding to its threshold voltage value, which is set at said desired reference drain voltage level, and maintaining its drain voltage level at a fixed value.

13. A programming circuit of a memory cell, comprising:
a selection circuit having a terminal for coupling to the memory cell;

a regulation transistor positioned between a first voltage reference and the selection circuit, said regulation transistor and said selection circuit being interconnected at a first inner circuit node;

a first voltage comparator having a first input terminal, a second input terminal feedback coupled to said first inner circuit node, and an output terminal coupled to a gate terminal of said regulation transistor;

a first reference circuit having an output terminal and structured to provide a first reference gate voltage value; and a second voltage comparator having a first input terminal coupled to the reference circuit, a second input terminal feedback coupled to said output terminal of said first voltage comparator, and an output terminal coupled to an enable terminal of said first voltage comparator.

14. The programming circuit according to claim 13, wherein said reference circuit is structured to set said reference gate voltage value to correspond to a programming current value equal to a reference current limit value at which the voltage between drain and source terminals of said memory cell is maintained fixed at a value equal to a desired programming drain voltage value.

15. The programming circuit according to claim 14, wherein said reference circuit has a structure corresponding to a structure of said programming circuit and comprises a duplicated regulation transistor similar in behavior to said regulation transistor and having a drain terminal connected to said first voltage reference and a source terminal connected to a reference inner circuit node maintained at said desired programming drain voltage value.

16. The programming circuit according to claim 15, wherein said reference circuit further comprises: a duplicated selection circuit positioned between said duplicated regulation transistor and a second voltage reference, said selection circuit showing a voltage—current characteristic identical to that of said memory cell when programmed at a desired threshold voltage level, the duplicated selection circuit including a generator structured to generate said reference current limit value.

17. The programming circuit according to claim 16, wherein said generator is regulated so as to supply a reference current value determined during a verify phase at the wafer level of a memory device which comprises said memory cell to take into account the process variability of the manufacturing of said device.

18. The programming circuit according to claim 17, said reference circuit further comprises a third voltage comparator having a first input terminal, a second input terminal feedback connected to said reference inner circuit node, and an output terminal coupled to a gate terminal of said duplicated regulation transistor and structured to supply the gate terminal of said duplicated regulation transistor with said reference gate voltage value.

19. The programming circuit according to claim 13, further comprising an enable block coupled between said first voltage reference and said regulation transistor and including an enable transistor having a gate terminal coupled to the output terminal of the second voltage comparator.

20. The programming circuit according to claim 13, further comprising:

a second reference circuit having an output terminal coupled to said second voltage comparator and structured to provide a second reference gate voltage value; and a selection pass-gate coupled between the output terminal of the second reference circuit and said second voltage comparator.

21. A memory device, comprising:

a memory cell; and a programming circuit coupled to the memory cell and structured to program the memory cell, the programming circuit including:

a selection circuit having a terminal for coupling to the memory cell;

a regulation transistor positioned between a first voltage reference and the selection circuit, said regulation transistor and said selection circuit being interconnected at a first inner circuit node;

a first voltage comparator having a first input terminal, a second input terminal feedback coupled to said first inner circuit node, and an output terminal coupled to a gate terminal of said regulation transistor;

a first reference circuit having an output terminal and structured to provide a first reference gate voltage value; and a second voltage comparator having a first input terminal coupled to the reference circuit, a second input terminal feedback coupled to said output terminal of said first voltage comparator, and an output terminal coupled to an enable terminal of said first voltage comparator.

22. The memory device according to claim 21, wherein said reference circuit is structured to set said reference gate voltage value to correspond to a programming current value equal to a reference current limit value at which the voltage between drain and source terminals of said memory cell is maintained fixed at a value equal to a desired programming drain voltage value.

23. The memory device according to claim 22, wherein said reference circuit has a structure corresponding to a structure of said programming circuit and comprises a duplicated regulation transistor similar in behavior to said regulation transistor and having a drain terminal connected to said first voltage reference and a source terminal connected to a reference inner circuit node maintained at said desired programming drain voltage value.

24. The memory device according to claim 23, wherein said reference circuit further comprises: a duplicated selection circuit positioned between said duplicated regulation transistor and a second voltage reference, said selection circuit showing a voltage—current characteristic identical to that of said memory cell when programmed at a desired threshold voltage level, the duplicated selection circuit including a generator structured to generate said reference current limit value.

25. The memory device according to claim 24, wherein said generator is regulated so as to supply a reference current value determined during a verify phase at the wafer level of a memory device which comprises said memory cell to take into account the process variability of the manufacturing of said device.

26. The memory device according to claim 25, said reference circuit further comprises a third voltage comparator having a first input terminal, a second input terminal feedback connected to said reference inner circuit node, and an output terminal coupled to a gate terminal of said duplicated regulation transistor and structured to supply the gate terminal of said duplicated regulation transistor with said reference gate voltage value.

27. The memory device according to claim 21, wherein the programming circuit includes an enable block coupled between said first voltage reference and said regulation transistor and including an enable transistor having a gate terminal coupled to the output terminal of the second voltage comparator.

28. The memory device according to claim 21, wherein the programming circuit includes:

a second reference circuit having an output terminal coupled to said second voltage comparator and structured to provide a second reference gate voltage value; and a selection pass-gate coupled between the output terminal of the second reference circuit and said second voltage comparator.

* * * * *